US012575334B2

(12) United States Patent
Lin et al.

(10) Patent No.: US 12,575,334 B2
(45) Date of Patent: **\*Mar. 10, 2026**

(54) MAGNETIC TUNNEL JUNCTION (MTJ) ELEMENT AND ITS FABRICATION PROCESS

(71) Applicant: TAIWAN SEMICONDUCTOR MANUFACTURING COMPANY LTD., Hsinchu (TW)

(72) Inventors: Tsann Lin, Hsinchu (TW); Ya-Ling Lee, Hsinchu City (TW)

(73) Assignee: TAIWAN SEMICONDUCTOR MANUFACTURING COMPANY LTD., Hsinchu (TW)

( \* ) Notice: Subject to any disclaimer, the term of this patent is extended or adjusted under 35 U.S.C. 154(b) by 0 days.

This patent is subject to a terminal disclaimer.

(21) Appl. No.: 18/669,572

(22) Filed: May 21, 2024

(65) Prior Publication Data

US 2024/0315144 A1 Sep. 19, 2024

Related U.S. Application Data

(63) Continuation of application No. 17/395,962, filed on Aug. 6, 2021, now Pat. No. 12,022,743.

(51) Int. Cl.
| | |
|---|---|
| *H10N 50/80* | (2023.01) |
| *H01F 10/32* | (2006.01) |
| *H10B 61/00* | (2023.01) |

| | |
|---|---|
| *H10N 50/01* | (2023.01) |
| *H10N 50/85* | (2023.01) |

(52) U.S. Cl.
CPC ............. *H10N 50/80* (2023.02); *H10B 61/22* (2023.02); *H10N 50/01* (2023.02); *H10N 50/85* (2023.02); *H01F 10/3286* (2013.01)

(58) Field of Classification Search
None
See application file for complete search history.

(56) References Cited

U.S. PATENT DOCUMENTS

| | | | | |
|---|---|---|---|---|
| 12,022,743 B2 * | 6/2024 | Lin | ...................... | H01F 10/3254 |
| 2020/0006425 A1 | 1/2020 | Lin et al. | | |

\* cited by examiner

*Primary Examiner* — Kevin M Bernatz
(74) *Attorney, Agent, or Firm* — WPAT LAW; Anthony King

(57) ABSTRACT

A magnetic tunnel junction (MTJ) element is provided. The MTJ element includes a buffer layer, a seed layer disposed over the buffer layer, a first ferromagnetic layer disposed over the seed layer, a tunnel barrier layer disposed over the first ferromagnetic layer and a second ferromagnetic layer disposed over the tunnel barrier layer. The seed layer includes a Cobalt (Co)-based film. The buffer layer includes cobalt (Co) and hafnium (Hf). The buffer layer is alloyed with chromium and has chromium content up to 20 at. %. The MTJ element in accordance with the present disclosure exhibits a low resistance desired for a low-power write operation, and a high TMR coefficient desired for a low bit-error-rate (BER) read operation.

20 Claims, 12 Drawing Sheets

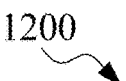

1200

| Forming a diffusion barrier layer over an inter-level dielectric layer | ∼1201 |

↓

| Forming a bottom electrode layer over the diffusion barrier layer | ∼1202 |

↓

| Performing an etching process to form holes in the bottom electrode layer and diffusion barrier layer and define a bottom electrode and a diffusion barrier | ∼1203 |

↓

| Forming an insulator layer over the bottom electrode and within the holes | ∼1204 |

↓

| Performing a planarization process | ∼1205 |

↓

| Forming buffer layer, seed layer, hard bias stack, MTJ stack, cap layer, top electrode, hard mask and photoresist over the bottom electrode | ∼1206 |

↓

| Performing an etching process to remove the hard mask, the photoresist and a portion of the buffer layer, seed layer, hard bias stack, MTJ stack, cap layer, and top electrode | ∼1207 |

↓

| Forming a spacer covering the buffer layer, seed layer, hard bias stack, MTJ stack, capping layer, and top electrode | ∼1208 |

↓

| Forming an ILD layer and a top electrode via over the top electrode | ∼1209 |

↓

| Forming a conductive via over the top electrode via and forming a conductive wire over the interconnect via | ∼1210 |

FIG. 12

MAGNETIC TUNNEL JUNCTION (MTJ) ELEMENT AND ITS FABRICATION PROCESS

CROSS-REFERENCE TO RELATED APPLICATIONS

This application is a continuation of U.S. application Ser. No. 17/395,962 (now U.S. Pat. No. 12,022,743 B2, issued on Jun. 25, 2024), filed on Aug. 6, 2021. The above-referenced application is hereby incorporated herein by reference in their entirety.

BACKGROUND

Many modern electronic devices contain various types of memories, such as a non-volatile hard disk drive or a volatile random access memory (RAM). A non-volatile memory is able to retain its stored data in the absence of power, whereas a volatile memory loses its stored data when power is lost. A magnetic tunnel junction (MTJ) element used in the hard disk drive can also be used in the RAM, and thus are promising candidates for the next-generation non-volatile RAM. This magnetic random access memory (MRAM) is currently explored to facilitate a static random access memory (SRAM) to own a high non-volatile storage density. The MRAM includes an array of densely packed MRAM cells. In each MRAM cell, an MTJ element is integrated with a transistor to perform write and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 illustrates a flowchart representing a method for forming an MRAM according to the present disclosure.

DETAILED DESCRIPTION

Figure 1:
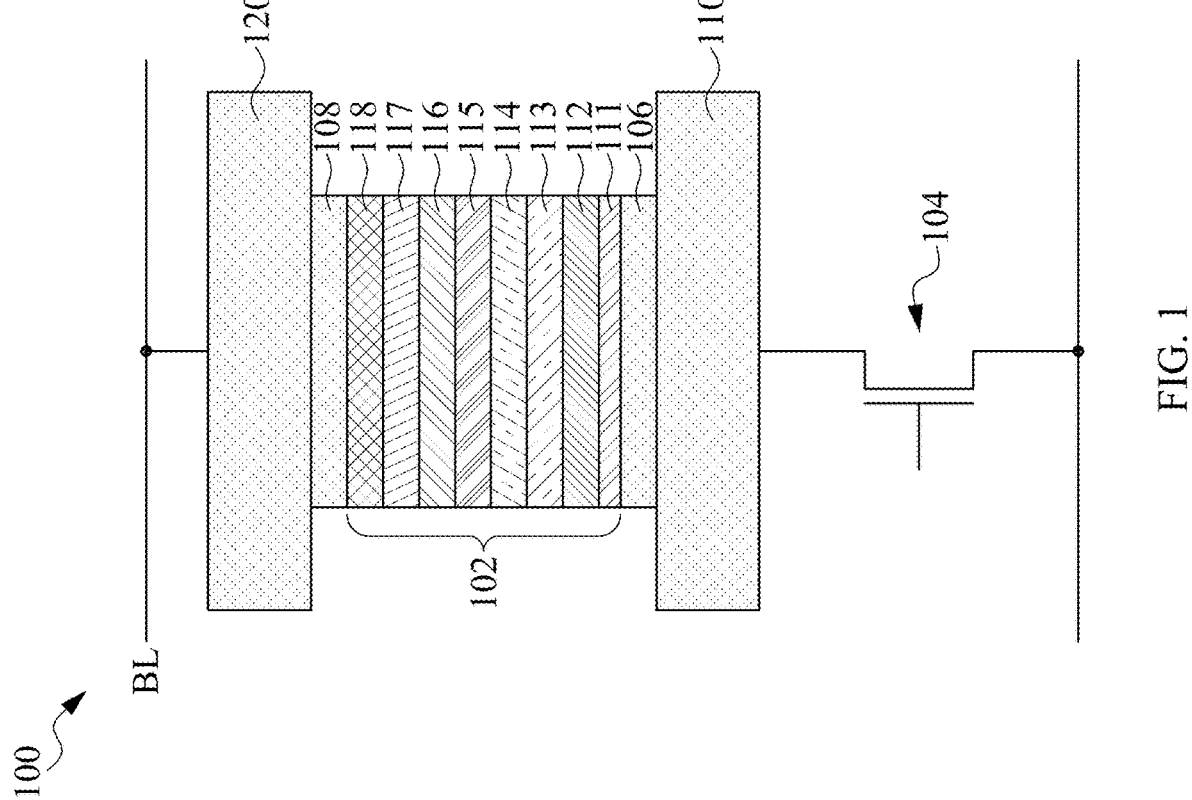
FIG. 1 illustrates a schematic view of some embodiments of an MRAM including a magnetic tunnel junction (MTJ) element according to the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the following disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A magnetic tunnel junction (MTJ) clement mainly includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, it is more likely that electrons will tunnel through the tunnel barrier layer, such that the MTJ element is in a low-resistance state. Conversely, if the magnetization directions of the reference layer and free layer are in an anti-parallel orientation, it is less likely that electrons will tunnel through the tunnel barrier layer, such that the MTJ element is in a high-resistance state. Consequently, the MTJ element can be switched between two states of electrical resistance, a first state with a low resistance ($R_P$: magnetization directions of the reference layer and the free layer are parallel) and a second state with a high resistance ($R_{AP}$: magnetization directions of the reference layer and the free layer are antiparallel). Because of this binary nature, MTJ elements are used in memory cells to store digital data, with the low resistance state $R_P$ corresponding to a first data state (e.g., logical "0"), and the high-resistance state $R_{AP}$ corresponding to a second data state (e.g., logical "1"). A performance of the MTJ element is measured by a product of resistance and area (RA), as well as a tunnel magnetoresistance (TMR) coefficient, which is a ratio of $(R_{AP}-R_P)/R_P$. The MTJ element is designed to have a low RA mainly for low-power write performance, and a high TMR coefficient mainly for a broad read window between "0" and "1".

Typically, an MTJ element disposed between a bottom electrode and a top electrode includes a buffer layer, a seed layer, a hard-bias layer, an antiparallel coupling layer, a reference layer, a tunnel barrier layer, a free layer and a cap layer. The buffer layer disposed over the bottom electrode preferably exhibits an amorphous structure to reduce or even eliminate unwanted microstructural effects originating from the bottom electrode, thereby facilitating its overlying metallic films to grow and develop their own crystalline textures. The seed layer disposed over the buffer layer exhibits a face-centered-cubic (fcc) polycrystalline structure with a <111> crystalline texture to facilitate its overlying hard-bias layer, antiparallel coupling layer and lower portion of the reference layer to epitaxially grow and develop the same structure and texture. While buffer layer is amorphous and exhibits no grain boundaries, the seed layer is polycrystalline and exhibits a significant number of grain boundaries which may lead to imperfections in the MTJ element. The significant number of grain boundaries may extend into the overlying hard-bias layer, antiparallel coupling layer and lower portion of the reference layer through epitaxial growth, and may stop at a spacer layer of the reference layer which exhibits a body-centered-cubic (bcc) polycrystalline structure. The extended grain boundary acts as a diffusion path, thus deteriorating the performance of the MTJ element. Particularly, in comparative embodiments, the seed layer is the only metallic film not containing Co among all metallic films in the MTJ element, and thus creating substantial chemical potentials for diffusion of dissimilar atoms. For example, when a seed layer is formed of a 60Ni-40Cr film (in atomic percent, it is nonmagnetic after deposition, but becomes magnetic after annealing for 5 hour at 400° C. Even the Cr content is as high as 40 at %, a lot of Ni atoms diffuse out to create a significant amount of magnetic moments which affect the design of the MTJ element.

To alleviate these diffusion concerns, the present disclosure provides an MTJ element with a seed layer comprising laminated or alloyed Co and Cr films. The resulting MTJ element exhibits a lower RA and a greater magnetoresistance (TMR) coefficient. Consequently, the performance of the MTJ element is improved.

In some further embodiments, the present disclosure provides an MTJ element with a seed layer comprising laminated or alloyed Co and Cr films, and with a buffer layer doped with nitrogen or alloyed with Cr to enhance its amorphous status. As a result, the MTJ element basically contains Co in most layers, thus further minimizing its chemical potentials and alleviating the diffusion concerns. Consequently, the performance of the MTJ element is improved.

FIG. 1 is a schematic view of an MRAM cell 100 in accordance with some embodiments of the present disclosure. The MRAM cell 100 includes an MTJ element 102 and an access transistor 104. The MTJ element 102 is disposed between a bottom electrode 106 and a top electrode 108. The access transistor 104 is coupled to the MTJ element 102 by a first metal wire 110 disposed under a bottom electrode 106. A bit line (BL) is coupled to one end of the MTJ element 102 through a top electrode 108 disposed under a second metal wire 120, and a source line (SL) is coupled to an opposite end of the MTJ element 102 through the access transistor 104. Thus, application of a suitable word line (WL) voltage to a gate electrode of the access transistor 104 couples the MTJ element 102 between the BL and the SL. Consequently, by providing suitable bias conditions, the MTJ element 102 can be switched between two states of electrical resistance, a first state with a low resistance (magnetization directions of reference layer and free layer are parallel) and a second state with a high resistance (magnetization directions of reference layer and free layer are antiparallel), to store data.

The MTJ element 102 illustrated in FIG. 1 includes a buffer layer 111, a seed layer 112, a hard-bias layer 113, an antiparallel coupling (APC) layer 114, a reference layer 115, a tunnel barrier layer 116, a free layer 117, and a cap layer 118. The reference layer 115 and the free layer 117 are separated by the tunnel barrier layer 116. The reference layer 115 has a fixed magnetization, while the free layer 117 has a variable magnetization that can be switched to change between two binary data states for the MTJ element 102. The hard-bias layer 113 is arranged below the reference layer 115 to fix the magnetization of the reference layer 115 through antiparallel coupling induced by the antiparallel coupling (APC) layer 114 arranged between the reference layer 115 and the hard-bias layer 113. In some embodiments, the APC layer 114 is optional and not a part of the MTJ element 102. The cap layer 118, which may also be referred to as a perpendicular magnetic anisotropy (PMA) protection layer in some contexts, is disposed over the free layer 117.

Figure 2:
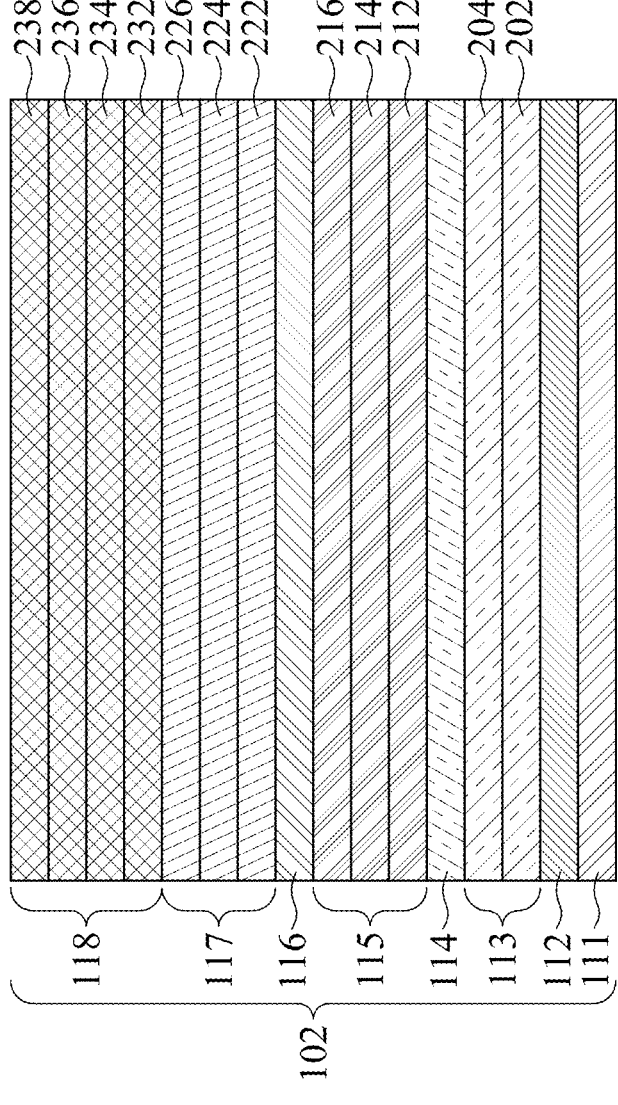
FIG. 2 illustrates a cross-sectional view of some embodiments of an MTJ element according to the present disclosure.

FIG. 2 shows a more detailed example of an MTJ element 102 in accordance with some embodiments.

The buffer layer 111 is disposed over the bottom electrode 106 and below the seed layer 112. In some embodiments, the buffer layer 111 is amorphous and can eliminate unwanted microstructural effects originating from the bottom electrode 106 and facilitate its overlying films to develop their own desired crystalline structures and orientations. In some embodiments, the buffer layer 111 is nonmagnetic so that it does not interact with the magnetics of its overlying films.

In some embodiments, the buffer layer 111 may be or include an amorphous, nonmagnetic film of the form X-Z (where X is iron (Fe), cobalt (Co), or the like, and Z is hafnium (Hf), yttrium (Y), zirconium (Zr), or the like); and in further embodiments, the buffer layer 111 may be substantially free from Ta or other diffusive species which may diffuse during high temperature processes (e.g., annealing). In some embodiments, the buffer layer 111 is a Co—Hf film with an Hf content ranging from 18 atomic percentage (at. %) to 40 at. % (e.g., 18 at. %, 20 at. %, 25 at. %, 30 at. %, 35 at. % or 40 at. %). The Co—Hf film may have an Co content of 82 at. % or below (e.g., 82 at. %, 80 at. %, 75 at. %, 70 at. %, 65 at. %, 60 at. %, or below). In some embodiments, other atoms, such as nitrogen (N) or chromium (Cr), may be doped in or alloyed with the Co—Hf film such that the Co content may be lower than 82 at. % or even lower than 60 at. %. Nitrogen atoms are much smaller than Co (or Fe) atoms, and thus can distort crystalline lattices to facilitate the formation of the amorphous phase and reduce the surface roughness which is known as one of the major sources of MTJ performance degradation. In some embodiments, the Co—Hf film has a nitrogen content up to 30 at. % (i.e., in a range of 0 at. % to 30 at. %). In some embodiments, the Co—Hf film has a chromium content up to 20 at. % (i.e., in a range of 0 at. % to 20 at. %). In some embodiments, the addition of nitrogen (N) or chromium (Cr) atoms into the Co—Hf film can reduce unwanted magnetic moments occurring during a high temperature processing (e.g., annealing at 400° C.). In addition, since the Co—Hf film is amorphous and has no or less grain boundaries as diffusion paths, the buffer layer 111 may act as a diffusion barrier layer to prevent the hard-bias layer 113 and other layers in the MTJ clement 102 from diffusion of metallic atoms of the underlying bottom electrode. In some embodiments, the buffer layer 111 may have a smooth morphology and a thickness ranging from approximately 1 nm to approximately 10 nm.

The seed layer 112 is disposed over the buffer layer 111. In some embodiments, the seed layer 112 exhibits a face-centered-cubic (fcc) phase. In some embodiments, the thickness of the seed layer 112 can be adjusted so that the seed layer 112 exhibits a strong <111> crystalline texture for its overlying films to epitaxially grow, thereby also developing strong <111> crystalline textures.

In some embodiments, the seed layer 112 has a similar chemical composition to the buffer layer 111. In some embodiments, both of the buffer layer 111 and the seed layer 112 include Co-based films. The seed layer 112 may include materials such as cobalt (Co) and chromium (Cr). In some embodiments, the seed layer 112 may include one or more laminated or alloyed Co and Cr films. In some embodiments, the seed layer 112 may include an alloyed Co and Cr film which has a Cr content ranging from 30 at % to 60 at % (e.g., 30 at. %, 35 at. %, 40 at. %, 45 at. %, 50 at. %, 55 at. %, or 60 at. %. In some embodiments, a ratio of Cr to Co ranges from 3:7 to 6:4. With sufficient amount of Co in the seed layer, the diffusion concerns can be alleviated and the performance of the MTJ element is improved. In some embodiments, the seed layer 112 may include a laminated structure of M repeats of alternating Co and Cr films. In some embodiments, M is an integral number greater than six and may be within a range of 6 to 10, but is not limited thereto. For example, in the embodiments illustrated in FIG. 2, the seed layer 112 may include a multilayer stack composed of alternating Co and Cr films which can be expressed as [Co/Cr]m where m is an integral number within a range of 6 to 10 and each of the Co and Cr films may have a thickness within a range of 0.1 nm to 0.4 nm. In some embodiments, each of the Co films may have a thickness of 0.3 nm or below so as to exhibit no or less residual magnetic moments.

The hard-bias layer 113 is disposed over the seed layer 112, which facilitates the hard-bias layer 113 to develop a strong fcc <111> crystalline texture, thereby exhibiting a high perpendicular magnetic anisotropy (PMA) and a high coercivity ($H_C$). The hard-bias layer 113 is a ferromagnetic material having a magnetization direction that is aligned or fixed when applying a high magnetic field in a direction perpendicular to film interfaces. In some embodiments, the hard-bias layer 113 may include a laminated structure of N repeats of alternating Co and Pt films. In some embodiments, N is an integral number greater than one and may be within a range of 3 to 6, but is not limited thereto. For example, in the embodiments illustrated in FIG. 2, the hard-bias layer 113 may include a multilayer stack 202 composed of alternating Co and Pt films, and a further Co film 204 disposed over the multilayer stack 202. The multilayer stack 202 is disposed over the seed layer 112 and may have a structure expressed as [Co/Pt]$_n$ where n is an integral number within a range of 3 to 6 and each of the Co and Pt films may have a thickness within a range of 0.2 nm to 0.4 nm. The further cobalt film 204 may have a thickness within a range of 0.6 nm to 1 nm. The hard-bias layer 113 may include any number of layers in any order with many suitable materials and thus FIG. 2 is merely an example.

In some of the comparative embodiments, the buffer layer 111 includes tantalum nitride (TaNx). The tantalum atoms are prone to diffuse from the seed layer into the tunnel barrier layer, adversely affecting the tunnel magnetoresistance effect. In addition, chemical potential difference between nitrogen (N) atoms in the buffer layer 111 and cobalt (Co) atoms in the other layers (e.g., the seed layer 112 or the hard-bias layer 113) may lead to substantial nitrogen (N) diffusion during a high temperature processing, at 400° C. and result in appearance of a polycrystalline phase in the buffer layer 111. Similarly, in some of the comparative embodiments, when a Ni-based film (e.g., nickel-chromium (Ni—Cr)) is used as the seed layer, chemical potential difference between the seed layer 112 including Ni atoms and other layers (e.g., the hard-bias layer 113) including no Ni atoms may lead to substantial nickel (Ni) diffusion during high temperature processing and result in appearance of unwanted magnetic moments.

The MTJ element 102 according to the present disclosure includes Co-based films for the buffer layer 111, the seed layer 112 and the hard-bias layer 113, which can reduce the chemical potential difference and lead to less diffusion of Co atoms and less unwanted magnetic moments. In addition, since a Co-based film is used to replace the Ni-based film of the seed layer 112 used in the comparative embodiments, the Ni diffusion droved by chemical potential difference and the appearance of unwanted magnetic moments resulted therefrom can be significantly reduced.

In some embodiments, the buffer layer 111, the seed layer 112 and the hard-bias layer 113 of the MTJ element 102 includes only Co-based films for the buffer layer 111, the seed layer 112 and the hard-bias layer 113. In some embodiments, the buffer layer 111 is a Co—Hf film with an Hf content ranging from 18 atomic percentage (at. %) to 40 at. %, the seed layer 112 is a multilayer stack expressed as [Co/Cr]$_m$ where m is an integral number within a range of 6 to 12 and the hard-bias layer 113 is a multilayer stack expressed as [Co/Pt]$_n$ where n is an integral number within a range of 6 to 12.

In some embodiments, the MTJ clement 102 may include an antiparallel coupling (APC) layer 114 disposed above the hard-bias layer 113 and separates the hard-bias layer 113 from the reference layer 115. The APC layer 114 ensures that the magnetization of the reference layer 115 is opposite to that of the hard-bias layer 113 through antiparallel coupling effect. In some embodiments, the APC layer 114 may be made of Ru and have a thickness of approximately 0.4 nm or within a range of approximately 0.3 nm to 0.5 nm; or the APC layer 114 may be made of Ir and have a thickness of approximately 0.5 nm or within a range of approximately 0.4 nm to 0.6 nm.

The reference layer 115 is disposed over the APC layer 114. The reference layer 115 is a ferromagnetic layer and has a magnetization direction that is "hard-biased" (fixed) by the hard-bias layer 113 through ferromagnetic coupling and/or antiferromagnetic coupling. In some embodiments, the magnetization direction of the reference layer 115 is opposite to that of the hard bias layer 113. In some embodiments, the reference layer 115 may include two ferromagnetic layers separated by a nonmagnetic layer. In some embodiments as illustrated in FIG. 2, the reference layer 115 includes a first ferromagnetic layer 212 disposed over the APC layer 114, a nonmagnetic layer 214 disposed over the first ferromagnetic layer 212 and a second ferromagnetic layer 216 disposed over the nonmagnetic layer 214. In some embodiments, the reference layer 115 may include a cobalt (Co) film 212, a molybdenum (Mo) film 214 and an iron-boron (Fe—B) film 216. In some embodiments, a thickness of the Co film is within a range of approximately 0.6 nm to approximately 1 nm, a thickness of the Mo film is within a range of approximately 0.1 nm to approximately 0.4 nm, and a thickness of the Fe—B film is within a range of approximately 0.6 nm to approximately 1.4 nm.

The Co film of the reference layer 115 has no intrinsic PMA, and is antiparallel-coupled with the underlying hard-bias layer 113 across the APC layer 114 to exhibit an extrinsic PMA. A strong antiparallel coupling may be attained by continuing the epitaxial growth facilitated by the seed layer 112 and developing the strong fcc <111> crystalline texture. In addition, the Mo film of the reference layer 115 exhibits a body-centered-cubic (bcc) phase which may terminate the epitaxial growth for its overlying Fe—B film of the reference layer 115 to grow with an amorphous phase.

The tunnel barrier layer 116, which can manifest as a thin dielectric layer film, is disposed over the reference layer and separates the reference layer 115 from the free layer 117. In some embodiments, the tunnel barrier layer 116 may include an amorphous film, such as aluminum oxide (AlO$_x$) or titanium oxide (TiO$_x$), or a polycrystalline film, such as manganese oxide (MgO). In embodiments where an MTJ element 102 is used, the tunnel barrier layer 116 is thin enough to allow quantum mechanical tunneling of current between the reference layer 115 and the free layer 117. In some embodiments, the tunnel barrier layer 116 may have a thickness ranging from approximately 0.6 nm to approximately 1.2 nm.

In some embodiments, a MgO film is used as the tunnel barrier layer 116. The MgO film of the tunnel barrier layer 116 acts as a PMA promotion layer which collaborates with the Mo film 214 of the reference layer 115 to facilitate the sandwiched Fe—B film 216 of the reference layer 115 to exhibit a strong insitu PMA. In addition, the MgO film of the tunnel barrier layer 116 exhibits a simple-cubic <001> crystalline texture after deposition, and may induce a transformation from amorphous to polycrystalline phases also with a <001> crystalline texture in its underlying Fe—B film of the reference layer 115 during annealing. Coherent tunneling will occur, thereby increasing the TMR coefficient.

The free layer 117 is disposed over the tunnel barrier layer 116. The free layer 117 is capable of changing its magnetization direction between one of two magnetization states, which correspond to binary data states stored in a MRAM memory cell. For example, in a first state, the free layer 117 can have a magnetization direction in which the magnetization of the free layer 117 is aligned in parallel with the magnetization direction of the reference layer 115, thereby providing the MTJ element 102 with a relatively low resistance. In a second state, the free layer 117 can have a magnetization direction which is aligned antiparallel with the magnetization direction of the ferromagnetic reference layer 115, thereby providing the MTJ element 102 with a relatively high resistance. In some embodiments, the free layer 117 may be depicted as a single layer. In other embodiments, the free layer 117 may be a multilayer. In some embodiments, the free layer 117 may include two ferromagnetic layers separated by a nonmagnetic layer. In some embodiments, the free layer 117 includes a first ferromagnetic layer 222 disposed over the tunnel barrier layer 116, a nonmagnetic layer 224 disposed over the first ferromagnetic layer 222 and a second ferromagnetic layer 226 disposed over the nonmagnetic layer 224. In some embodiments, the free layer 117 may include an iron-boron (Fe—B) film 222, a manganese (Mg) film 224 and a cobalt-iron-boron (Co—Fe—B) film 226. In some embodiments, a thickness of the Fe—B film 222 is within a range of approximately 0.8 nm to approximately 1.2 nm, a thickness of the Mg film 224 is within a range of approximately 0.3 nm to approximately 0.5 nm, and a thickness of the Co—Fe—B film 226 is within a range of approximately 0.4 nm to approximately 0.8 nm.

The MgO film of the tunnel barrier layer 116 also acts as a PMA promotion layer which collaborates with the Mg film 224 of the free layer 117 to facilitate the sandwiched Fe—B film 222 of the free layer 117 to exhibit a strong insitu PMA. In addition, the MgO film of the tunnel barrier layer 116 may also induce a transformation from amorphous to polycrystalline phases also with a <001> crystalline texture in its overlying Fe—B film 222 of the free layer 117 during annealing. Coherent tunneling will occur, thereby increasing the TMR coefficient.

The cap layer 118, which may be also referred to as a perpendicular magnetic anisotropy (PMA) protection layer in some contexts, is disposed over the free layer 117. In some embodiments, the cap layer 118 enhances anisotropy for the MTJ stack or protects it from degrading when the stack is built up. In some embodiments, the cap layer 118 may be depicted as a single layer. In other embodiments, the cap layer 118 may be a multilayer. As illustrated in FIG. 2, in some embodiments, the cap layer 118 may include a first cap layer 232, a second cap layer 234, a third cap layer 236 and a fourth cap layer 238. The cap layer 118 can include any number of layers in any order with many allowable materials and thicknesses and thus FIG. 2 is merely an example.

The cap layer 118 may include a first cap layer 232 formed of a dielectric MgO film disposed over the free layer 117. The MgO film used as the first cap layer 232 may have a thickness ranging from approximately 0.4 nm to approximately 1 nm. It may act as a perpendicular-magnetic-anisotropy (PMA) promotion layer which collaborates with the manganese (Mg) film 224 to facilitate the sandwiched Co—Fe—B film 226 to exhibit a strong PMA. As a result, the free layer 117 exhibits a strong PMA. In some embodiments, to ensure the strong PMA, the MgO film used as the first cap layer 232 has an oxygen content close to or substantially equivalent to that used as the tunnel barrier layer 116 so as to minimize oxygen chemical potentials between the two MgO films (i.e., 116, 232), thereby minimizing oxygen diffusion inside the free layer 117. In some embodiments, oxygen diffusion induced by a large oxygen chemical potential between the two MgO films may cause an increase in the resistance of the MTJ element 102, and a decrease in the TMR coefficient of the MTJ element 102.

In some embodiments, the second cap layer 234 may be a ferromagnetic film, such as a Co—Fe—B film. The Co—Fe—B film used as the second cap layer 234 may have a thickness ranging from approximately 0.2 nm to approximately 0.8 nm.

In some other embodiments, the second cap layer 234 may be a diffusion barrier layer which has an amorphous phase and contains no or less grain boundaries as diffusion paths. In some embodiments, the diffusion barrier layer is nonmagnetic so that it will not induce unwanted stray fields to interrupt the operation of the MTJ element 102. In some embodiments, the diffusion barrier layer includes an amorphous, nonmagnetic film of the form X-Z (where X is iron (Fe), cobalt (Co), or the like, and Z is hafnium (Hf), yttrium (Y), zirconium (Zr), or the like). In some embodiments, the diffusion barrier layer includes a Co-based film. In some embodiments, the diffusion barrier layer includes a Co—Hf film with an Hf content ranging from 18 atomic percentage (at. %) to 40 at. % (e.g., 18 at. %, 20 at. %, 25 at. %, 30 at. %, 35 at. % or 40 at. %). The Co—Hf film may have an Co content of 82 at. % or below (e.g., 82 at. %, 80 at. %, 75 at. %, 70 at. %, 65 at. %, 60 at. %, or below). In some embodiments, other atoms such as nitrogen (N) or chromium (Cr) may be doped in or alloyed with the Co—Hf film such that the Co content may be lower than 82 at. % or even lower than 60 at. %. In other words, the Co—Hf film may have a nitrogen content ranging from 0 at. % to 30 at. % or a chromium content ranging from 0 at. % to 20 at. %. Nitrogen atoms are much smaller than Co (or Fe) atoms, and thus can distort crystalline lattices to facilitate the formation of the amorphous phase. The presence of nitrogen (N) and/or chromium (Cr) in the Co—Hf film may further inhibit the formation of unwanted magnetic moments during the annealing process. In some embodiments, the Co—Hf film may have a thickness ranging from 1 nm to 10 nm.

In some embodiments, the cap layer 118 may further include one or more cap layers disposed over the second cap layer 234. In some embodiments, the cap layer 118 may include an additional cap layer 236 or 238 disposed over the second cap layer 234 as illustrated in FIG. 2. Each of the additional cap layers 236 or 238 can be independently included in the cap layer 118 or the additional cap layers 236 and 238 can be both included in the cap layer 118. In some embodiments, the additional cap layer 236 is a third cap layer disposed over the second cap layer 234 and the additional cap layer 238 is a fourth cap layer disposed over the third cap layer 236. The additional cap layer 236 may include molybdenum (Mo), or tungsten (W), or nickel-chromium (Ni—Cr). The additional cap layer 238 may include tantalum (Ta) or ruthenium (Ru). The additional cap layer 238 may be disposed over the additional cap layer 236. In some embodiments, the additional cap layer 238 may include a multilayer stack composed of tantalum (Ta) and ruthenium (Ru) (e.g., a trilayer stack of Ta/Ru/Ta). In some embodiments, each layer in the additional cap layers 236 and 238 may have a thickness ranging from approximately 1 nm to approximately 10 nm.

The Ta film of the additional cap layer 238 has a high affinity to oxygen atoms, and may trap oxygen gases during annealing, thereby protecting the MTJ element 102 from oxygen penetration from ambient processing environments. Without such protection, the oxygen penetration may result in a very high RA and a very low TMR coefficient.

In some embodiments, the second cap layer 234 of the cap layer 118 is a diffusion barrier layer (e.g., Co—Hf film) and thus it can prevent the diffusion. For example, when the additional cap layer 236 or 238 includes materials having high affinity to oxygen atom, such as Ta film, the Ta film may also trap oxygen atoms from the MgO film of the first cap layer 232 or the MgO film of the tunnel barrier layer 116, thereby varying the oxygen chemical potentials between the two MgO films and deteriorating TMR properties. On the other hand, Ta atoms of the Ta film may penetrate into the underlying layers, leading to a loss of magnetic moments of the free layer 117 and deteriorating the TMR properties. The diffusion barrier layer of the cap layer 118 can prevent the atoms (such as oxygen) from diffusing out from the MTJ element 102 and being recaptured by the tantalum (Ta), tungsten (W) or molybdenum (Mo) film and thus alleviating concerns on electrical shorting or electrical opening. In addition, the diffusion barrier layer of the cap layer 118 can also prevent the diffusive species, such as tantalum (Ta) from the overlying layers or oxygen atoms from an ambient processing environment, from entering the MTJ element 102. Therefore, in some embodiments, with the present of a diffusion barrier layer, the cap layer 118 can be made without a Ta film (i.e., Ta-free).

The Ta film used as the additional cap layer 238 may be eliminated or replaced by a low-resistivity film, such as a Ni—Cr film illustrated in some embodiments according to the present disclosure as the additional cap layer 236. The Ni—Cr film has a high affinity to oxygen atoms and a capability of trapping oxygen gases during annealing, thereby protecting the MTJ element 102 from oxygen penetration from ambient processing environments. In some embodiments, the nickel-chromium (Ni—Cr) film may have a thickness of approximately 6 nm. The Cr content in the additional cap layer 236 may range from approximately 30 at. % to approximately 50 at. %. In some embodiments, the Cr content in the additional cap layer 236 is high enough to form a nonmagnetic layer 236.

In some embodiments, the MTJ element of the present disclosure can be implemented as a Ta-free MTJ element. The main MTJ structure is "sealed" between two Co—Hf films (one used in a buffer layer 111 and the other used in a cap layer 118). The Co—Hf films exhibit a "hard" amorphous phase which will remain as it is during annealing at a high temperature, such as at 400° C., for a long time period, such as 5 hours, and therefore, can effectively act as diffusion barrier.

In some embodiments, by replacing the TaNx film with an amorphous, magnetic Co-based film as the buffer layer 111 or replacing the Ni—Cr film with a Co-based film as the seed layer 112, a decrease in the product of resistance and area (RA) of the MTJ element 102 and an increase in the TMR coefficient of the MTJ element 102 can be achieved. With a low resistance, low voltages can be applied to the transistor 104 for a low write current to perform low-power write operations. With a high TMR coefficient, a separation between codes "0" and "1" will be large enough to minimize a bit-error-rate (BER) when performing read operations. In some embodiments, in spite of the above advantages, the elimination of the TaNx buffer layer may lead to a high yield. In some embodiments, in spite of the above advantages, the elimination of the Ni—Cr seed layer may lead to a good device performance at high temperature.

Figure 3:
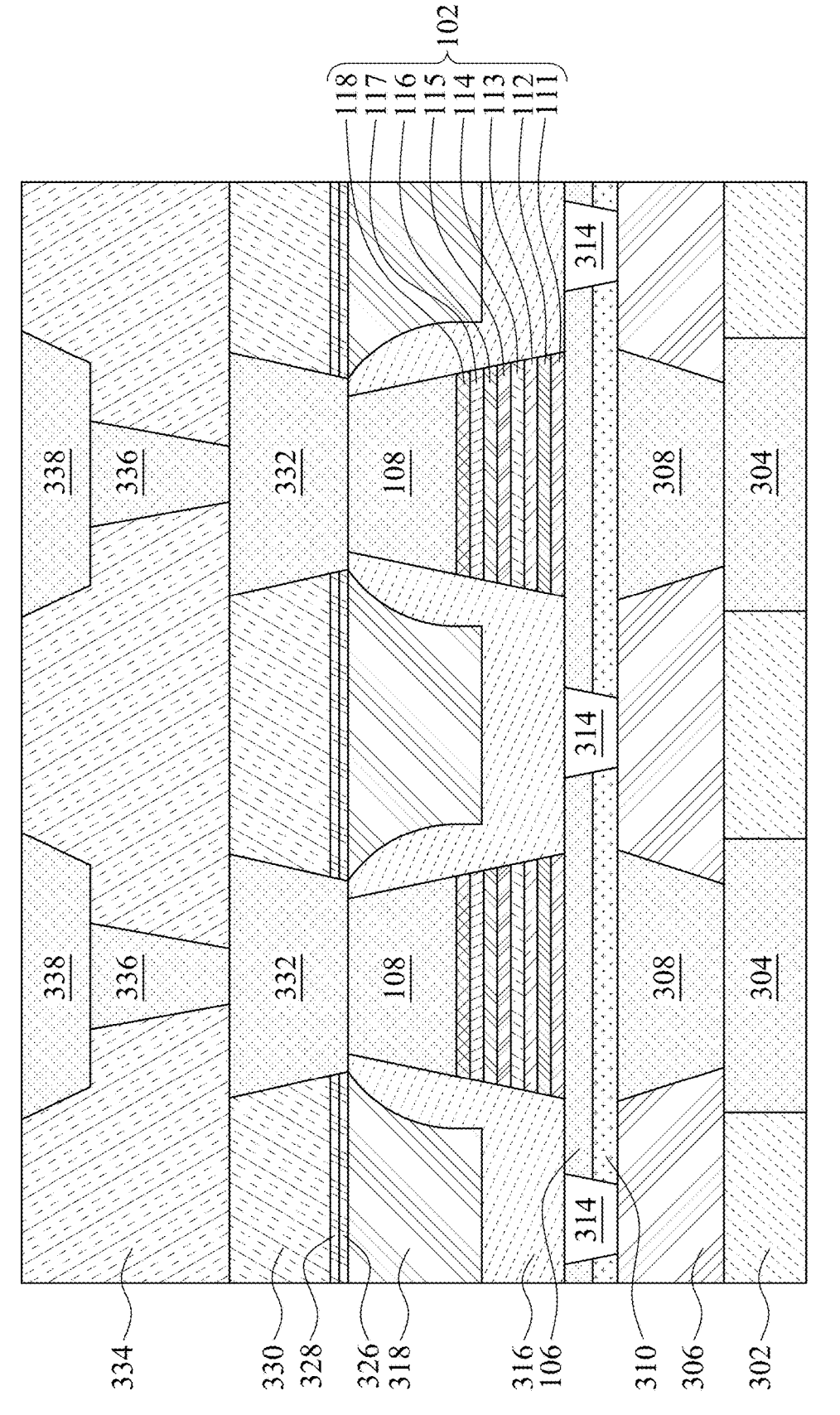
FIG. 3 illustrates a cross sectional view of some embodiments of an MRAM according to the present disclosure.

FIG. 3 illustrates a cross sectional view of some embodiments of a memory device (e.g., MRAM) 300, which includes MTJ elements 102. The memory device includes a lower conductive wire 304 disposed within a first inter-level dielectric (ILD) layer 302, a second ILD layer 306 disposed over the first ILD layer 302, a lower interconnect via 308 disposed over the lower conductive wire 304, a diffusion barrier layer 310 disposed over the lower interconnect via 308, a bottom electrode 106 disposed over the diffusion barrier layer 310 and an insulator layer 314 disposed over the second ILD layer 306. The MTJ elements 102 are disposed between the bottom electrode 106 and a top electrode 108. The bottom electrode 106 and the top electrode 108 are conductive, and may include, for example, metals, metal nitrides, or other suitable conductive materials. For example, but not limited thereto, the bottom electrode 106 and the top electrode 108 can include tantalum (Ta), tantalum nitride (TaN), titanium nitride (TiN), tungsten (W), tungsten nitride (WN), platinum (Pt), palladium (Pd), iridium (Ir), nickel-chromium (Ni—Cr), zirconium (Zr), or niobium (Nb). In some embodiments, the lower interconnect via 308 and the conductive wire 304 include metal, such as copper or tungsten (W).

The MTJ element 102 includes a buffer layer 111, a seed layer 112 over the buffer layer 111, a hard-bias layer 113 over the seed layer 112, an antiparallel coupling (APC) layer 114 over the hard-bias layer 113, a reference layer 115 over the APC layer 114, a tunnel barrier layer 116 over the reference layer 115, a free layer 117 over the tunnel barrier layer 116, and a cap layer 118 over the free layer 117. Details of the MTJ element 102 are disclosed hereinabove.

A spacer 316 covers sidewalls of the MTJ element 102 and the top electrode 108. In some embodiments, the spacer 316 may also cover a top surface of the bottom electrode 106 and a top surface of the insulator layer 314. In some embodiments, the spacer 316 is formed of silicon nitride. A third ILD layer 318 is disposed over the spacer 316. In some embodiments, the third ILD layer 318 is a tetra-ethyl-ortho-silicate (TEOS) layer. A first dielectric layer 326 is disposed over the third ILD layer 318. In some embodiments, the first dielectric layer 326 is a silicon carbide (SiC) layer. A second dielectric layer 328 is disposed over the first dielectric layer 326. In some embodiments, the second dielectric layer 328 is a TEOS layer. A fourth ILD layer 330 is disposed over the second dielectric layer 328. A top electrode via 332 is disposed over the top electrode 108. A fifth ILD layer 334 is disposed over the fourth ILD layer 330. In some embodiments, the fifth ILD layer 334 is made of a low k dielectric material. A conductive via 336 is disposed over the top electrode via 332. A conductive wire 338 is disposed over the conductive via 336. In some embodiments, the conductive wire 338 and the conductive via 336 include metal, such as copper or aluminum.

FIGS. 4-11 illustrate cross-sectional views 400 to 1100 of some embodiments of a method of forming a memory device (e.g., MRAM) according to the present disclosure.

Figure 4:
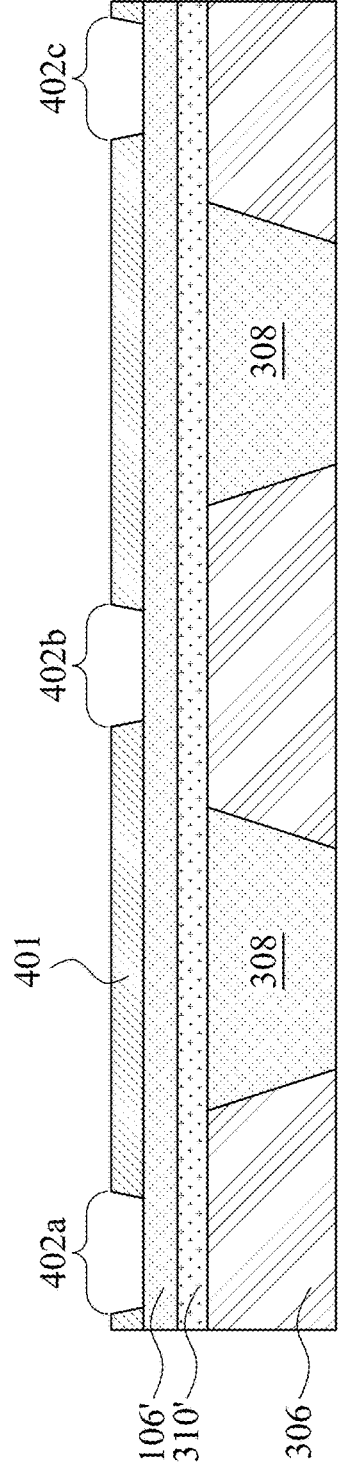
FIGS. 4-11 illustrate cross-sectional views of some embodiments of a method of forming an MRAM according to the present disclosure.

As shown in a cross-sectional view 400 of FIG. 4, an interconnect via 308 is formed within a second ILD layer 306. A diffusion barrier layer 310' is formed over the second ILD layer 306. A bottom electrode layer 106' is formed over the diffusion barrier layer 310'. A masking layer 401 is formed over the bottom electrode layer 106'. The masking layer 401 defines one or more openings 402a, 402b and 402c above a top surface of the bottom electrode layer 106'.

Figure 5:
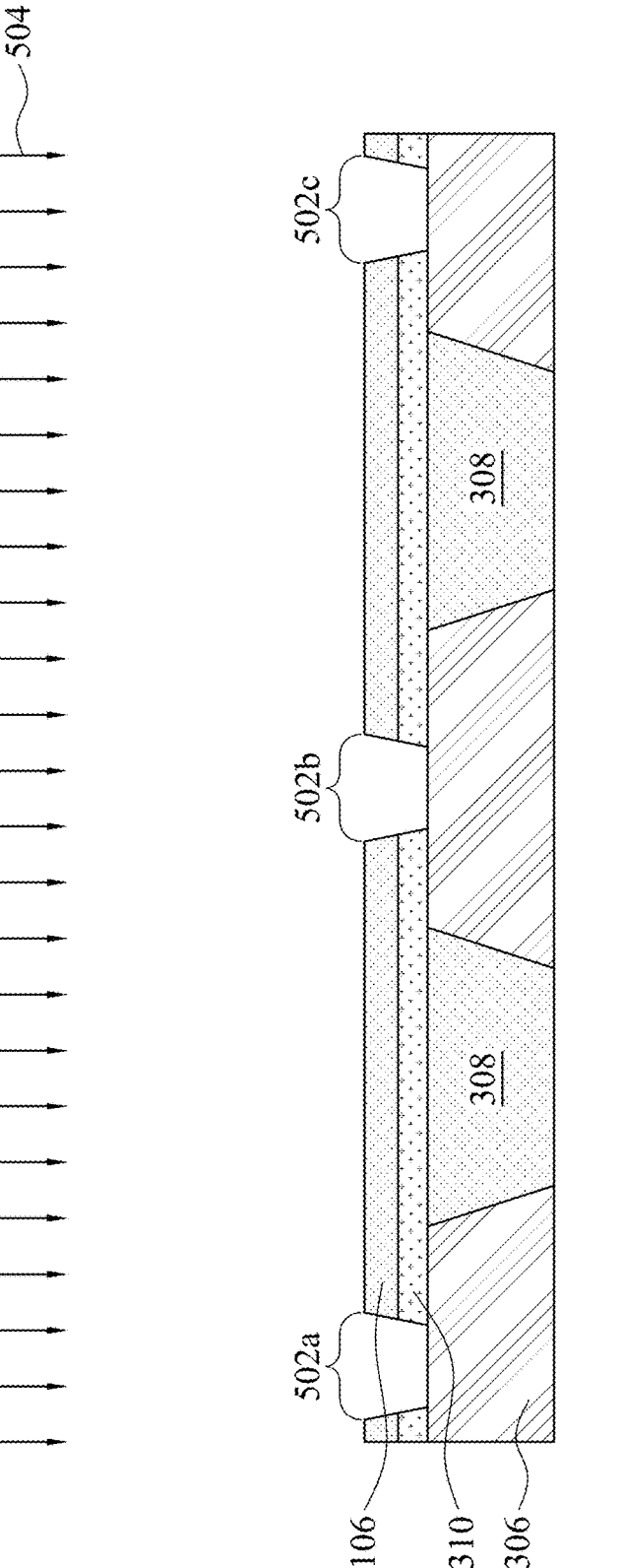

As shown in a cross-sectional view 500 of FIG. 5, an etching process is performed to etch the masking layer 401, the bottom electrode layer 106', and the diffusion barrier layer 310' and then a bottom electrode 106 and a diffusion barrier layer 310 defined by openings 502a, 502b and 502c are formed. In some embodiments, an etchant 504 is used.

Figure 6:
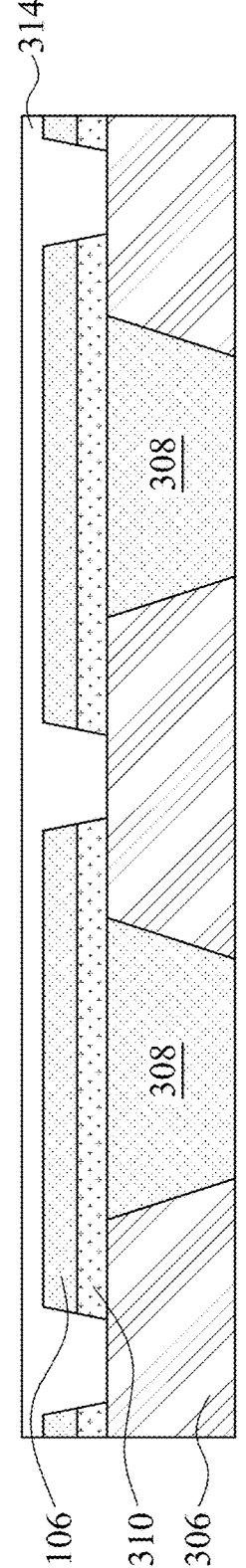

As shown in a cross-sectional view 600 of FIG. 6, an insulator layer 314' is formed over the bottom electrode 106. The insulator layer 106 fills the openings 502a, 502b and 502c shown in FIG. 5.

Figure 7:
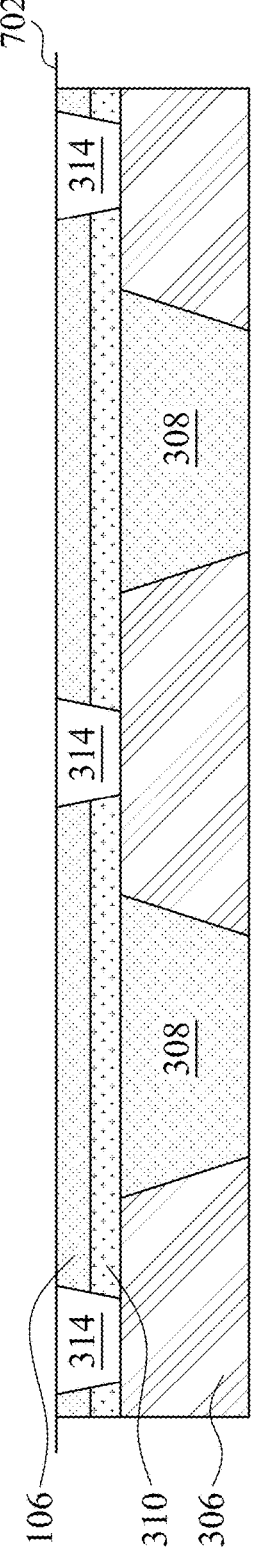
Figure 7:

As shown in a cross-sectional view 700 of FIG. 7, a chemical mechanical planarization (CMP) process is performed along line 702. The CMP process removes a portion of the insulator layer 314' shown in FIG. 6 and forms an insulator layer 314 shown in FIG. 7.

Figure 8:
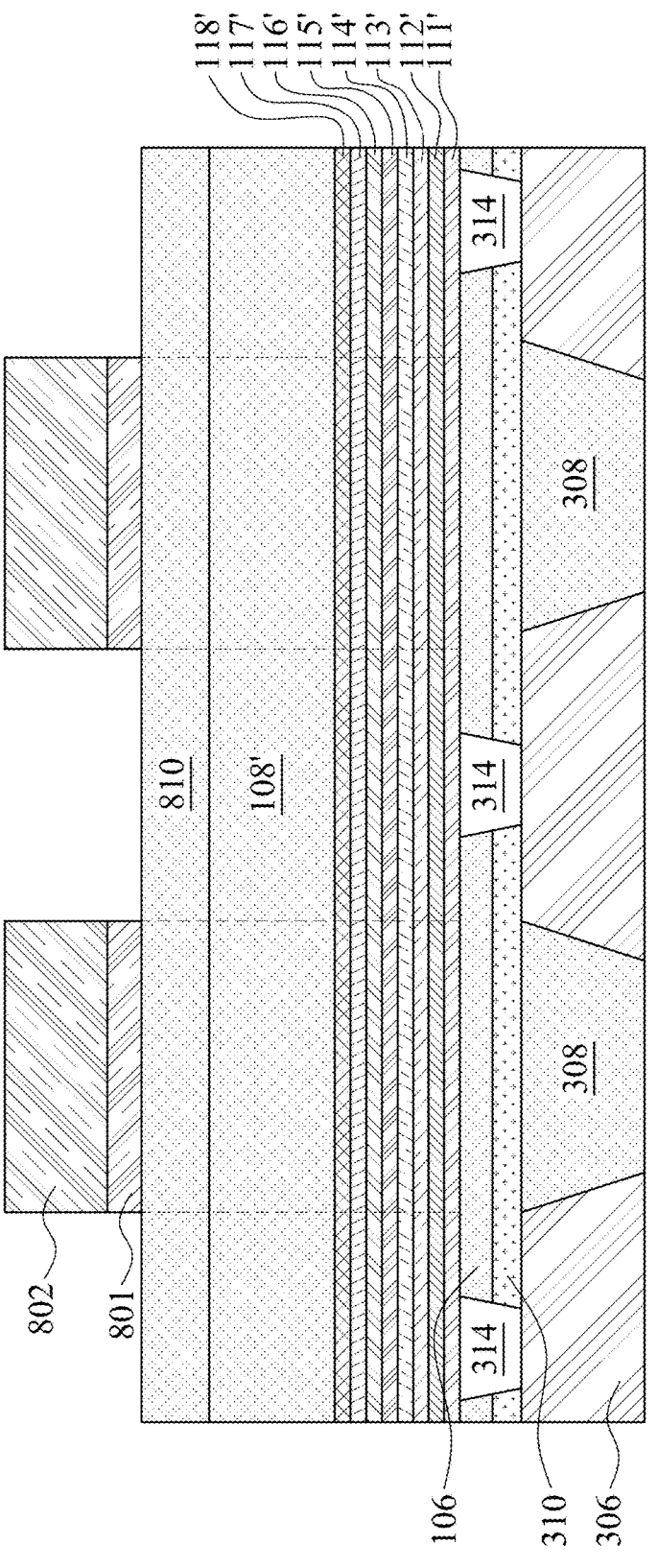

As shown in a cross-sectional view 800 of FIG. 8, a buffer layer 111', a seed layer 112', a hard bias layer 113', an APC layer 114', a reference layer 115', a tunnel barrier layer 116' and a free layer 117' are formed over the bottom electrode 106. A cap layer 118' is formed over the free layer 117' and a top electrode layer 108' is formed over the cap layer 118'. A hard mask layer 810 is formed over the top electrode layer 108'. A masking layer 801 and photoresist 802 are formed over the hard mask layer 810. The masking layer 801 and photoresist 802 are patterned and cover a portion of the hard mask layer 810.

Figure 9:
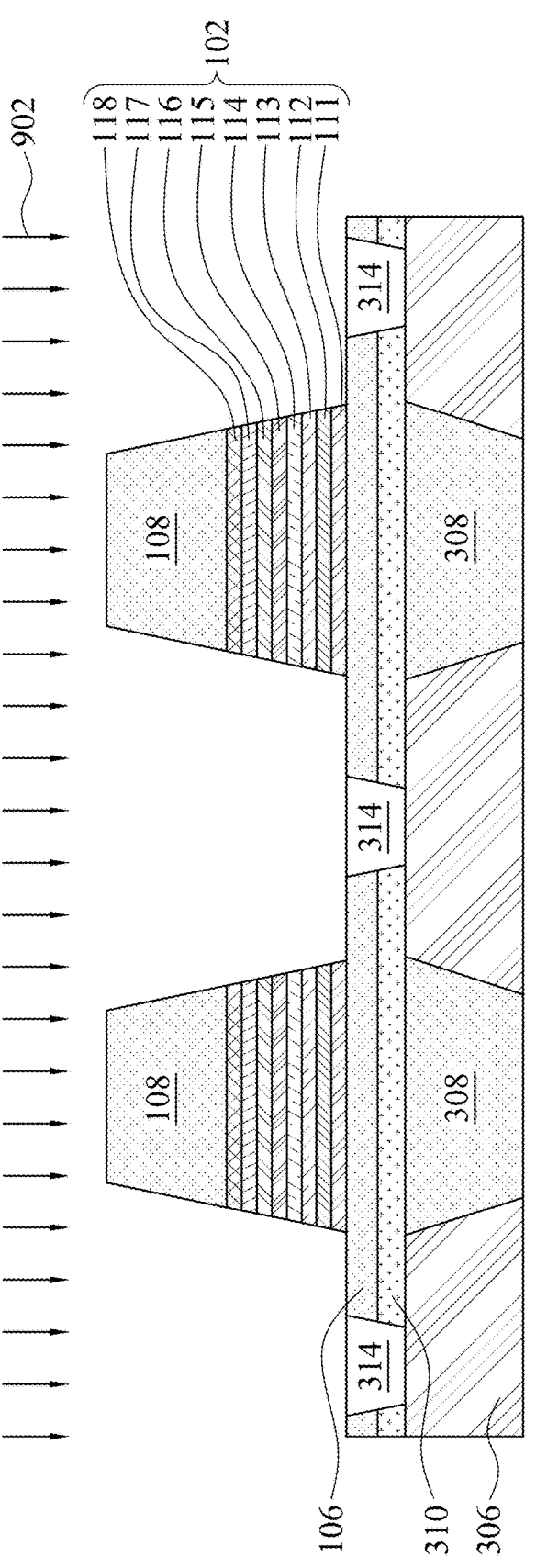
Figure 9:

As shown in a cross-sectional view 900 of FIG. 9, an etching process is performed using an etchant 902 to remove the portion of the underlying layers which are uncovered by the masking layer 801 so as to transfer the pattern of the masking layer 801 to the underlying layers. The etching process also removes the hard mask layer 810, the masking layer 801 and photoresist 802. Then MTJ elements 102 including a buffer layer 111, a seed layer 112, a hard bias layer 113, an APC layer 114, a reference layer 115, a tunnel barrier layer 116 and a free layer 117 and a cap layer 118 are formed and sandwiched between the bottom electrode 106 and the top electrode 108.

Figure 10:
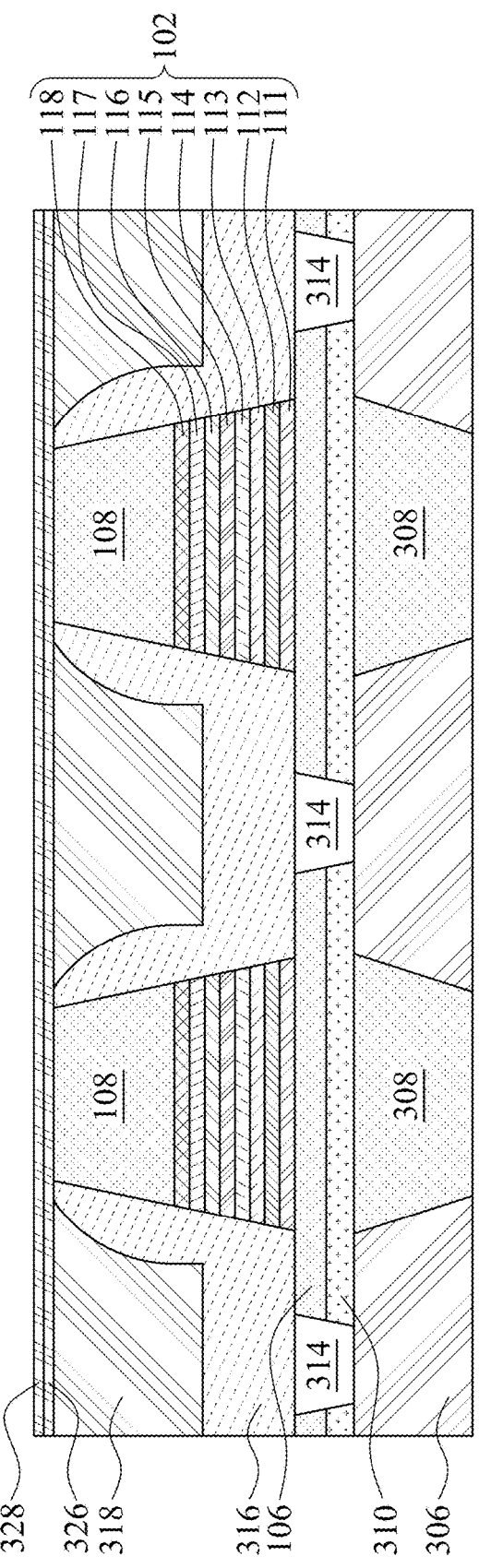

As shown in a cross-sectional view 1000 of FIG. 10, a spacer 316 is formed over the bottom electrode 106 and covers the sidewalls of the top electrode 108 and the MTJ element 102. A third ILD layer 318 is formed over the spacer 316. A first dielectric layer 326 is formed over the second ILD layer 318. A second dielectric layer 328 is formed over the first dielectric layer 326.

Figure 11:
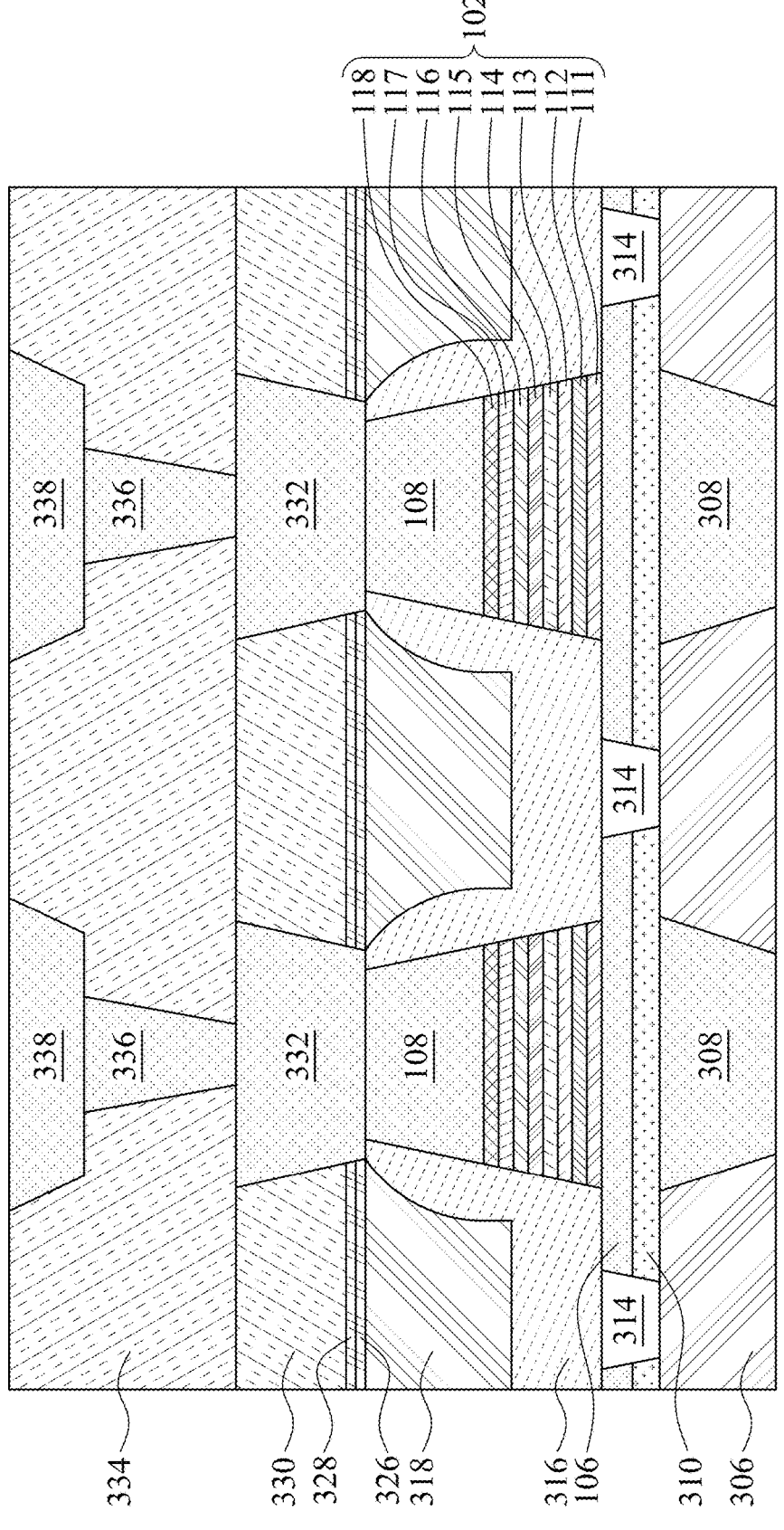

As shown in a cross-sectional view 1100 of FIG. 11, a fourth ILD layer 330 is formed over the second dielectric layer 328. A top electrode via 332 is formed over the top electrode 108. A fifth ILD layer 334 is formed over the fourth ILD layer 330. A conductive via 336 is formed over the top electrode via 332. A conductive wire 338 is formed over the conductive via 336.

The method for forming a semiconductor device (e.g., a memory device) including the MTJ element 102 will be described according to one or more embodiments. FIG. 12 is a flowchart representing a method 1200 for forming a semiconductor device including the MTJ element 102 according to aspects of the present disclosure. The method 1200 includes a number of operations. It should be noted that the operations of the method 1200 may be rearranged or otherwise modified within the scope of the various aspects. It should further be noted that additional operations may be provided before, during, and after the method 1200, and that some other operations may only be briefly described herein. Thus, other implementations are possible within the scope of the various aspects described herein.

At operation 1201, a diffusion barrier layer 310' is formed over an inter-level dielectric (ILD) layer 306. At operation 1202, a bottom electrode layer 106' is formed over the diffusion barrier layer 310'. FIG. 4 illustrates a cross-sectional view 400 corresponding to some embodiments of operations 1201 and 1202.

At operation 1203, an etch process is performed to form holes in the bottom electrode layer and diffusion barrier layer, defining a bottom electrode 106 and a diffusion barrier 310. FIG. 5 illustrates a cross-sectional view 500 corresponding to some embodiments of operation 1203.

At operation 1204, an insulator layer 314' is formed over the bottom electrode 206, filling within the holes. FIG. 6 illustrates a cross-sectional view 600 corresponding to some embodiments of operation 1204.

At operation 1205, a planarization process is performed to remove a portion of the insulator layer 314' and insulators 314 are formed. FIG. 7 illustrates a cross-sectional view 700 corresponding to some embodiments of operation 1205.

At operation 1206, a buffer layer 111', seed layer 112', hard bias layer 113', MTJ stack (114', 115', 116', 117'), cap layer 118', top electrode 108', hard mask 810 and photoresist 802 are formed over the bottom electrode. FIG. 8 illustrates a cross-sectional view 800 corresponding to some embodiments of operation 1206.

At operation 1207, an etching process is performed to remove the hard mask 801, photoresist 802, and a portion of the buffer layer, seed layer, hard bias layer, MTJ stack, cap layer, and top electrode. FIG. 9 illustrates a cross-sectional view 900 corresponding to some embodiments of operation 1207.

At operation 1208, a spacer 316 is performed over the buffer layer 111, seed layer 112, hard bias layer 113, MTJ stack (114, 115, 116, 117), cap layer 118, and the top electrode 108. FIG. 10 illustrates a cross-sectional view 1000 corresponding to some embodiments of operation 1208.

At operation 1209, an inter-level dielectric (ILD) layer 330 and a top electrode via 332 are formed over the top electrode 108. At operation 1210, conductive via 336 is formed over the top electrode via 332 and a conductive wire 338 is formed over the conductive via 336. FIG. 11 illustrates a cross-sectional view 1100 corresponding to some embodiments of operations 1209 and 1210.

Accordingly, the present disclosure provides an MTJ element including a buffer layer, a seed layer disposed over the buffer layer, a reference layer disposed over the seed layer, a tunnel barrier layer disposed over the reference layer, and a free layer disposed over the tunnel barrier layer. The seed layer includes a Cobalt (Co)-based film or has a similar composition to the buffer layer and/or other layers. The resulting MTJ element has a lower RA and a greater TMR coefficient. Consequently, write and read performance of the MTJ element is improved.

In some embodiments, the present disclosure relates to a magnetic tunnel junction (MTJ) element. The MTJ element includes a buffer layer, a seed layer disposed over the buffer layer, a reference layer disposed over the seed layer, a tunnel barrier layer disposed over the reference layer and a free layer disposed over the tunnel barrier layer. The seed layer includes a Cobalt (Co)-based film.

In other embodiments, the present disclosure relates to a magnetic tunnel junction (MTJ) element. The magnetic tunnel junction (MTJ) element includes a buffer layer, a seed layer disposed over the buffer layer, a reference layer disposed over the seed layer, a tunnel barrier layer disposed over the reference layer, and a free layer disposed over the tunnel barrier layer. The buffer layer, the seed layer, the reference layer and the free layer contain Cobalt (Co).

In yet other embodiments, the present disclosure relates to a method for manufacturing a semiconductor device. The method includes the following operations: forming a buffer layer over a bottom electrode layer; forming a seed layer over the buffer layer; forming a hard bias layer over the seed layer; and forming an MTJ stack comprising a reference layer, a tunnel barrier layer and a free layer over the hard bias layer. The seed layer includes a Cobalt (Co)-based film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic tunnel junction element (MTJ), comprising:
   a buffer layer;
   a seed layer disposed over the buffer layer;
   a first ferromagnetic layer disposed over the seed layer;
   a tunnel barrier layer disposed over the first ferromagnetic layer; and
   a second ferromagnetic layer disposed over the tunnel barrier layer,
   wherein the seed layer comprises a Cobalt (Co)-based film,
   wherein the buffer layer comprises cobalt (Co) and hafnium (Hf), and
   wherein the buffer layer is alloyed with chromium and has chromium content up to 20 at. %.

2. The magnetic tunnel junction element of claim 1, wherein the seed layer comprises cobalt (Co) and chromium (Cr).

3. The magnetic tunnel junction element of claim 2, wherein the seed layer is a laminated structure of alternating Co and Cr films.

4. The magnetic tunnel junction element of claim 3, wherein the seed layer is a laminated structure expressed as $[Co/Cr]_m$ where m is an integral number within a range of 2 to 6.

5. The magnetic tunnel junction element of claim 1, wherein the buffer layer comprises an amorphous and non-magnetic film of a form X-Z, where X is Co and Z is Hf.

6. The magnetic tunnel junction element of claim 1, further comprises a hard bias layer disposed over the seed layer and below the first ferromagnetic layer, wherein the hard bias layer comprises a Cobalt (Co)-based film.

7. The magnetic tunnel junction element of claim 6, wherein the hard bias layer is a laminated structure expressed as $[Co/Pt]_n$ where n is an integral number within a range of 3 to 6.

8. The magnetic tunnel junction element of claim 1, which is substantially free of tantalum.

9. A semiconductor device, comprising:
   a bottom electrode;
   a buffer layer disposed over the bottom electrode;
   a seed layer disposed over the buffer layer;
   at least one ferromagnetic layer disposed over the seed layer; and
   a top electrode disposed over the at least one ferromagnetic layer,
   wherein the seed layer comprises a Cobalt (Co)-based film,
   wherein the buffer layer comprises cobalt (Co) and hafnium (Hf), and
   wherein the buffer layer is alloyed with chromium and has chromium content up to 20 at. %.

10. The semiconductor device of claim 9, wherein the seed layer comprises a cobalt (Co) and chromium (Cr) film, and the Co-Cr film has a Cr content ranging from 30 at. % to 60 at. %.

11. The semiconductor device of claim 9, wherein the seed layer is a laminated structure expressed as $[Co/Cr]_m$ where m is an integral number within a range of 6 to 10, Co has a thickness ranging from 0.1 to 0.4 nm, and Cr has a thickness ranging from 0.1 to 0.4 nm.

12. The semiconductor device of claim 9, wherein the buffer layer has a Hf content ranging from 18 at. % to 40 at. %.

13. The semiconductor device of claim 9, further comprising a hard-bias layer disposed over the seed layer and below the at least one ferromagnetic layer, wherein the hard-bias layer comprises a Cobalt (Co)-based film.

14. The semiconductor device of claim 13, wherein the hard-bias layer is a laminated structure of alternating Co and Pt films expressed as $[Co/Pt]_n$, where n is an integral number within a range of 3 to 6.

15. The semiconductor device of claim 14, wherein each of the Co and Pt films has a thickness within a range of 0.2 nm to 0.4 nm.

16. The semiconductor device of claim 9, further comprising a cap layer disposed over the at least one ferromagnetic layer and below the top electrode, wherein the cap layer comprises MgO.

17. The semiconductor device of claim 9, further comprising:

a first cap layer disposed over the at least one ferromagnetic layer and comprising a MgO film; and a second cap layer disposed over first cap layer and below the top electrode, and comprising a ferromagnetic film.

18. A semiconductor device, comprising:

a bottom electrode;

a buffer layer disposed over the bottom electrode;

a seed layer disposed over the buffer layer;

at least one ferromagnetic layer disposed over the seed layer;

a cap layer disposed over the at least one ferromagnetic layer; and a top electrode disposed over the cap layer, wherein the cap layer comprises MgO, wherein the seed layer comprises a Cobalt (Co)-based film, wherein the buffer layer comprises cobalt (Co) and hafnium (Hf), and wherein the buffer layer is alloyed with chromium and has chromium content up to 20 at. %.

19. The semiconductor device of claim 18, wherein the cap layer comprises:

a first cap layer disposed over the at least one ferromagnetic layer and comprising a MgO film; and a second cap layer disposed over first cap layer and comprising a ferromagnetic film.

20. The semiconductor device of claim 18, further comprising a hard bias layer disposed between the seed layer and the at least one ferromagnetic layer, wherein the hard bias layer comprises a Cobalt (Co)-based film.

* * * * *